United States Patent
Fu et al.

(10) Patent No.: US 10,084,107 B2
(45) Date of Patent: Sep. 25, 2018

(54) TRANSPARENT CONDUCTING OXIDE FOR PHOTOVOLTAIC DEVICES

(71) Applicant: SolarCity Corporation, San Mateo, CA (US)

(72) Inventors: Jianming Fu, Palo Alto, CA (US); Zheng Xu, Pleasanton, CA (US); Jiunn Benjamin Heng, Los Altos Hills, CA (US); Chentao Yu, Sunnyvale, CA (US)

(73) Assignee: Tesla, Inc., Palo Alto, CA (US)

( * ) Notice: Subject to any disclaimer, the term of this patent is extended or adjusted under 35 U.S.C. 154(b) by 134 days.

(21) Appl. No.: 14/954,831

(22) Filed: Nov. 30, 2015

(65) Prior Publication Data

US 2016/0087138 A1    Mar. 24, 2016

Related U.S. Application Data

(63) Continuation of application No. 13/155,112, filed on Jun. 7, 2011, now Pat. No. 9,214,576.

(Continued)

(51) Int. Cl.
*H01L 31/074* (2012.01)
*H01L 31/0216* (2014.01)
(Continued)

(52) U.S. Cl.
CPC ...... *H01L 31/074* (2013.01); *H01L 31/02167* (2013.01); *H01L 31/022466* (2013.01); *H01L 31/022475* (2013.01); *H01L 31/072* (2013.01); *H01L 31/075* (2013.01); *H01L 31/1804* (2013.01); *H01L 31/1868* (2013.01);
(Continued)

(58) Field of Classification Search
CPC .............. H01L 31/1884; H01L 31/022466
See application file for complete search history.

(56) References Cited

U.S. PATENT DOCUMENTS

| 819,360 A | 3/1902 | Mayer |
| 2,626,907 A | 1/1953 | De |

(Continued)

FOREIGN PATENT DOCUMENTS

| CN | 1253381 | 5/2000 |
| CN | 1416179 | 10/2001 |

(Continued)

OTHER PUBLICATIONS

Cui, et al., Advanced Materials, 2001, vol. 13, pp. 1476-1480. (Year: 2001).*

(Continued)

*Primary Examiner* — Sadie White
(74) *Attorney, Agent, or Firm* — Shun Yao; Park, Vaughan, Fleming & Dowler LLP

(57) ABSTRACT

One embodiment of the present invention provides a solar cell. The solar cell includes a Si base layer, a passivation layer situated above the Si base layer, a layer of heavily doped amorphous Si (a-Si) situated above the passivation layer, a first transparent-conducting-oxide (TCO) layer situated above the heavily doped a-Si layer, a back-side electrode situated below the Si base layer, and a front-side electrode situated above the first TCO layer. The first TCO layer comprises at least one of: GaInO, GaInSnO, ZnInO, and ZnInSnO.

9 Claims, 4 Drawing Sheets

Related U.S. Application Data

(60) Provisional application No. 61/353,119, filed on Jun. 9, 2010.

(51) Int. Cl.
    *H01L 31/18*     (2006.01)
    *H01L 31/0224*     (2006.01)
    *H01L 31/072*     (2012.01)
    *H01L 31/075*     (2012.01)

(52) U.S. Cl.
    CPC ........... *Y02E 10/547* (2013.01); *Y02E 10/548* (2013.01); *Y02P 70/521* (2015.11)

(56) References Cited

U.S. PATENT DOCUMENTS

| | | |
|---|---|---|
| 2,938,938 A | 5/1960 | Dickson |
| 3,094,439 A | 6/1963 | Mann |
| 3,116,171 A | 12/1963 | Nielsen |
| 3,459,597 A | 8/1969 | Baron |
| 3,676,179 A | 7/1972 | Bokros |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A * | 9/1986 | Hamakawa ....... H01L 31/03921 136/244 |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,729,970 A * | 3/1988 | Nath ....................... H01L 21/28 136/258 |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,155,051 A | 10/1992 | Noguchi |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,017,581 A | 1/2000 | Hooker |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,761,771 B2 | 7/2004 | Satoh |
| 6,803,513 B2 | 10/2004 | Beernink |
| 6,841,051 B2 | 1/2005 | Crowley |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,119,901 B2 | 2/2012 | Jang |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |

(56) References Cited

U.S. PATENT DOCUMENTS

| | | |
|---|---|---|
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0118865 A1* | 6/2003 | Marks ............ H01L 51/5206 428/690 |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112419 A1 | 6/2004 | Boulanger |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022746 A1 | 2/2005 | Lampe |
| 2005/0022861 A1 | 2/2005 | Rose |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami |
| 2005/0126622 A1 | 6/2005 | Mukai |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2005/0268963 A1 | 12/2005 | Jordan |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186853 A1 | 8/2007 | Gurary |
| 2007/0186968 A1 | 8/2007 | Nakauchi |
| 2007/0186970 A1 | 8/2007 | Takahashi |
| 2007/0187652 A1 | 8/2007 | Konno |
| 2007/0202029 A1 | 8/2007 | Burns |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0011350 A1 | 1/2008 | Luch |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1* | 2/2008 | Krasnov ......... H01L 31/022466 136/256 |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0149161 A1 | 6/2008 | Nishida |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0223439 A1 | 9/2008 | Deng |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0014055 A1 | 1/2009 | Beck |
| 2009/0056805 A1 | 3/2009 | Barnett |
| 2009/0065043 A1 | 3/2009 | Hadorn |
| 2009/0078318 A1 | 3/2009 | Meyers |
| 2009/0084439 A1 | 4/2009 | Lu |
| 2009/0101872 A1 | 4/2009 | Young |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu |
| 2009/0155028 A1 | 6/2009 | Boguslavskiy |
| 2009/0160259 A1 | 6/2009 | Ravindranath |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1* | 10/2009 | Zhou ............... H01L 31/02167 136/256 |
| 2009/0255574 A1 | 10/2009 | Yu |
| 2009/0272419 A1 | 11/2009 | Sakamoto |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1* | 1/2010 | Lee ............... H01L 31/02168 136/255 |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |

(56) References Cited

U.S. PATENT DOCUMENTS

| | | |
|---|---|---|
| 2010/0240172 A1 | 9/2010 | Rana |
| 2010/0243021 A1 | 9/2010 | Lee |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0300525 A1 | 12/2010 | Lim |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0073175 A1 | 3/2011 | Hilali |
| 2011/0088762 A1 | 4/2011 | Singh |
| 2011/0120518 A1 | 5/2011 | Rust |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu |
| 2012/0318319 A1 | 12/2012 | Pinarbasi |
| 2012/0318340 A1 | 12/2012 | Heng |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1 | 8/2014 | Albadri |
| 2014/0261624 A1 | 9/2014 | Cruz-Campa |
| 2014/0299187 A1 | 10/2014 | Chang |
| 2014/0318611 A1 | 10/2014 | Moslehi |
| 2014/0345674 A1 | 11/2014 | Yang |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0340531 A1 | 11/2015 | Hayashi |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0163888 A1 | 6/2016 | Reddy |
| 2016/0190354 A1 | 6/2016 | Agrawal |
| 2016/0204289 A1 | 7/2016 | Tao |
| 2016/0322513 A1 | 11/2016 | Martin |
| 2016/0329443 A1 | 11/2016 | Wang |
| 2017/0084766 A1 | 3/2017 | Yang |

FOREIGN PATENT DOCUMENTS

| | | |
|---|---|---|
| CN | 101233620 | 7/2008 |
| CN | 101553933 | 10/2009 |
| CN | 100580957 C | 1/2010 |
| CN | 101305454 | 5/2010 |
| CN | 102088040 | 6/2011 |
| CN | 102263157 | 11/2011 |
| CN | 104205347 | 12/2014 |
| CN | 104409402 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | 102012010151 | 11/2013 |
| EP | 1770791 | 4/2007 |
| EP | 1816684 | 8/2007 |
| EP | 2071635 | 6/2009 |
| EP | 2113946 | 11/2009 |

(56) References Cited

FOREIGN PATENT DOCUMENTS

| | | |
|---|---|---|
| EP | 2362430 | 8/2011 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | 5789269 | 6/1982 |
| JP | H04245683 A | 9/1992 |
| JP | 06196766 | 7/1994 |
| JP | H07249788 A | 9/1995 |
| JP | 10004204 | 1/1998 |
| JP | 1131834 | 2/1999 |
| JP | 2000164902 | 6/2000 |
| JP | 2002057357 A | 2/2002 |
| JP | 2005159312 A | 6/2005 |
| JP | 2006523025 | 10/2006 |
| JP | 2006324504 | 11/2006 |
| JP | 2008135655 | 6/2008 |
| JP | 2009054748 | 3/2009 |
| JP | 2009177225 | 8/2009 |
| JP | 2011181966 | 9/2011 |
| JP | 2012119393 | 6/2012 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 1991017839 | 11/1991 |
| WO | 9120097 A1 | 12/1991 |
| WO | 2003083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010085949 | 8/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |
| WO | 2013020590 A1 | 2/2013 |
| WO | 2013046351 | 4/2013 |
| WO | 2014066265 | 5/2014 |
| WO | 2014074826 | 5/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

Kanani, Nasser. Electroplating: Basic Principles, Processes and Practice, Chapter 8—"Coating Thickness and its Measurement," 2004, pp. 247-291.

P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.

L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.

Hornbachner et al., "Cambered Photovoltaic Module and Method for its Manufacture" Jun. 17, 2009.

Machine translation of JP 10004204 A, Shindou et al.

Jianhua Zhao et al. "24% Efficient pert silicon solar cell: Recent improvements in high efficiency silicon cell research".

"Nonequilibrium boron doping effects in low-temperature epitaxial silicon" Meyerson et al., Appl. Phys. Lett. 50 (2), p. 113 (1987).

"Doping Diffusion and Implantation" Parthavi, <http://www.leb.eei.uni-erlangen.de/winterakademie/2010/report/content/course03/pdf/0306.pdf>.

Tomasi, "Back-contacted Silicon Heterojunction Solar Cells With Efficiency<21%" 2014 IEEE.

WP Leroy et al., "In Search for the Limits of Rotating Cylindrical Magnetron Sputtering", Magnetron, ION Processing and ARC Technologies European Conference, Jun. 18, 2010, pp. 1-32.

Beaucarne G et al: 'Epitaxial thin-film Si solar cells' Thin Solid Films, Elsevier-Sequoia S.A. Lausanne, CH LNKD- DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20diffusion%20_%201.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heteroj unction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

(56) References Cited

OTHER PUBLICATIONS

Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.

Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.

Meyerson et al. "Nonequilibrium boron doping effects in low-temperature epitaxial silicon", Appl. Phys. Lett. 50 (2), p. 113 (1987).

Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.

\* cited by examiner

TRANSPARENT CONDUCTING OXIDE FOR PHOTOVOLTAIC DEVICES

RELATED APPLICATION

This application is a continuation application of application Ser. No. 13/155,112, entitled "TRANSPARENT CONDUCTING OXIDE FOR PHOTOVOLTAIC DEVICES," by inventors Jianming Fu, Zheng Xu, Jiunn Benjamin Heng, and Chentao Yu, filed 7 Jun. 2011, which claims the benefit of U.S. Provisional Application No. 61/353,119, entitled "Transparent Conducting Oxide for Photovoltaic Devices," by inventors Jianming Fu, Zheng Xu, Jiunn Benjamin Heng, and Chentao Yu, filed 9 Jun. 2010.

BACKGROUND

Field

This disclosure is generally related to solar cells. More specifically, this disclosure is related to a solar cell that includes a high work function transparent conducting oxide (TCO) layer.

Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

For homojunction solar cells, minority-carrier recombination at the cell surface due to the existence of dangling bonds can significantly reduce the solar cell efficiency; thus, a good surface passivation process is needed. In addition, the relatively thick, heavily doped emitter layer, which is formed by dopant diffusion, can drastically reduce the absorption of short wavelength light. Comparatively, heterojunction solar cells, such as Si heterojunction (SHJ) solar cells, are advantageous. FIG. 1 presents a diagram illustrating an exemplary SHJ solar cell (prior art). SHJ solar cell 100 includes front finger electrode 102, a heavily doped amorphous-silicon (a-Si) emitter layer 104, an intrinsic a-Si layer 106, a crystalline-Si substrate 108, and an Al back-side electrode 110. Arrows in FIG. 1 indicate incident sunlight. Because there is an inherent bandgap offset between a-Si layer 106 and crystalline-Si (c-Si) layer 108, a-Si layer 106 can be used to reduce the surface recombination velocity by creating a barrier for minority carriers. The a-Si layer 106 also passivates the surface of crystalline-Si layer 108 by repairing the existing Si dangling bonds. Moreover, the thickness of heavily doped a-Si emitter layer 104 can be much thinner compared to that of a homojunction solar cell. Thus, SHJ solar cells can provide a higher efficiency with higher open-circuit voltage ($V_{oc}$) and larger short-circuit current ($J_{sc}$).

When fabricating solar cells, a layer of transparent conducting oxide (TCO) is often deposited on the a-Si emitter layer to form an ohmic-contact. However, due to the large band gap and high work function of the heavily doped $p^+$ amorphous Si emitter layer, it is hard to form low-resistance ohmic contact between a conventional TCO material, such as indium tin oxide (ITO), and the heavily doped a-Si emitter.

SUMMARY

One embodiment of the present invention provides a solar cell. The solar cell includes a Si base layer, a passivation layer situated on a first side of the Si base layer, a layer of heavily doped p-type amorphous semiconductor situated on the passivation layer, a first transparent-conducting-oxide (TCO) layer situated on the heavily doped amorphous semiconductor layer, and a first electrode situated on the first TCO layer. The first TCO layer comprises at least one of: GaInO, GaInSnO, ZnInO, and ZnInSnO.

In a variation on the embodiment, the first side of the Si base layer is facing the incident sunlight.

In a variation on the embodiment, the solar cell includes a second electrode situated on a second side of the Si base layer, and the second side is opposite to the first side.

In a further variation, the second side of the Si base layer is facing the incident sunlight, and the second electrode includes a second TCO layer and a metal grid comprising Cu and/or Ni.

In a variation on the embodiment, the Si base layer includes a crystalline-Si (c-Si) substrate.

In a variation on the embodiment, the Si base layer includes an epitaxially formed crystalline-Si (c-Si) thin film.

In a variation on the embodiment, the passivation layer includes at least one of: undoped a-Si and $SiO_x$.

In a variation on the embodiment, the heavily doped p-type amorphous semiconductor layer has a doping concentration between $1\times10^{17}/cm^3$ and $5\times10^{20}/cm^3$.

In a variation on this embodiment, the first TCO layer has a work function between 4.9 eV and 6.1 eV.

In a variation on the embodiment, the solar cell further comprises a third TCO layer situated on the first TCO layer, and the third TCO layer has a lower resistivity than the first TCO layer.

In a further variation, the third TCO layer includes at least one of: indium tin oxide (ITO), tin-oxide (SnOx), aluminum doped zinc-oxide (ZnO:Al), and Ga doped zinc-oxide (ZnO:Ga).

In a variation on the embodiment, the first electrode comprises at least one of: Ag, Cu, and Ni.

In a variation on the embodiment, the p-type amorphous semiconductor comprises amorphous Si or amorphous Si containing carbon.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide an SHJ solar cell that includes a layer of novel TCO material with high work function. The relatively high work function, up to 6.1 eV, of the TCO material ensures lower contact resistance and higher $V_{oc}$.

Figure 1:
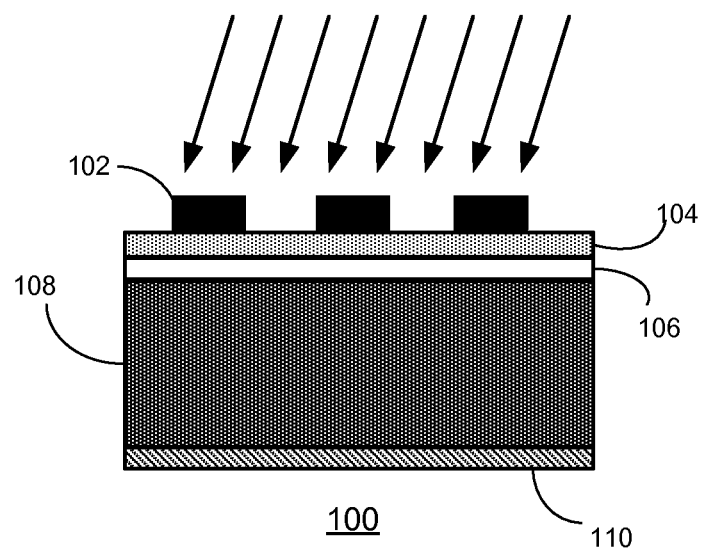
FIG. 1 presents a diagram illustrating an exemplary Si heterojunction (SHJ) solar cell (prior art).
Figure 2:
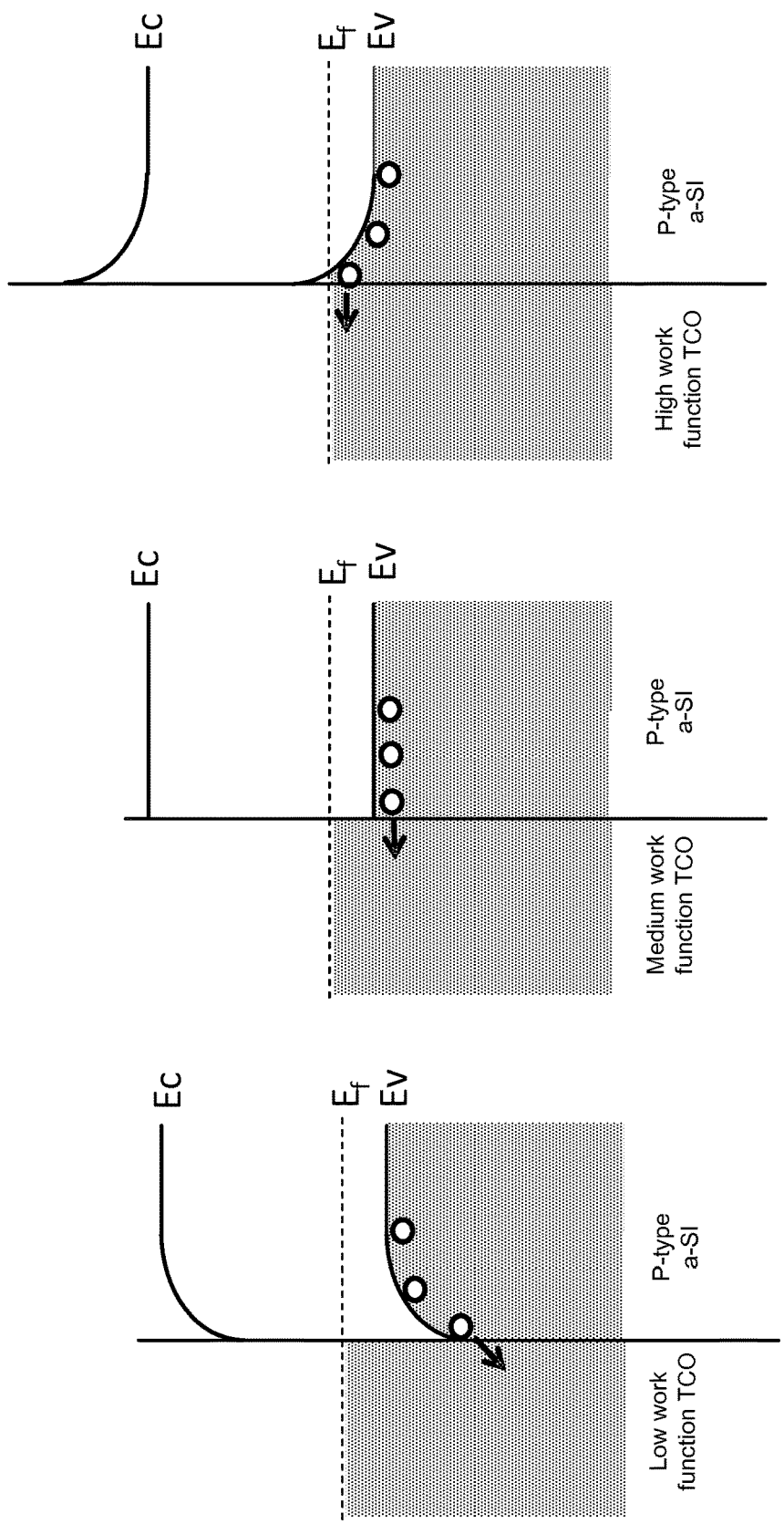
FIG. 2 presents a diagram illustrating the band diagrams at the interface between high/medium/low work function TCO material and p-type amorphous Si.

TCO film has been widely used in solar cells to form ohmic contact with the emitter layer. An SHJ solar cell can be formed by depositing a-Si layers on a c-Si substrate. Note that the a-Si layers include a layer of doped a-Si in order to form a junction with the c-Si substrate or to ensure good electrical contact with a subsequently formed electrode. A TCO layer is often deposited on the doped a-Si layer to form an ohmic contact. However, due to the large band gap and high work function of the p-type doped a-Si layer, it is difficult to find a TCO material with work function that is in alignment with the p-type a-Si in order to minimize the band bending at the TCO and p-type a-Si interface, and to reduce contact resistance and maximize open circuit voltage. For example, the work function of ITO is between 4.5 eV and 4.8 eV. This will cause band bending at TCO and p-type a-Si interface, and make it hard to achieve a low-resistance ohmic contact and high $V_{oc}$. FIG. 2 presents a diagram illustrating the band diagrams at the interface between high/medium/low work function TCO material and p-type amorphous Si. From the band diagram, one can see that, for TCO material with low or medium work function, potential barriers at the interface make it harder for charges (holes) to migrate from the p-type a-Si material to the TCO, thus resulting in higher contact resistance. Hence, it is desirable to use a TCO material that has a relatively high work function.

Figure 3:
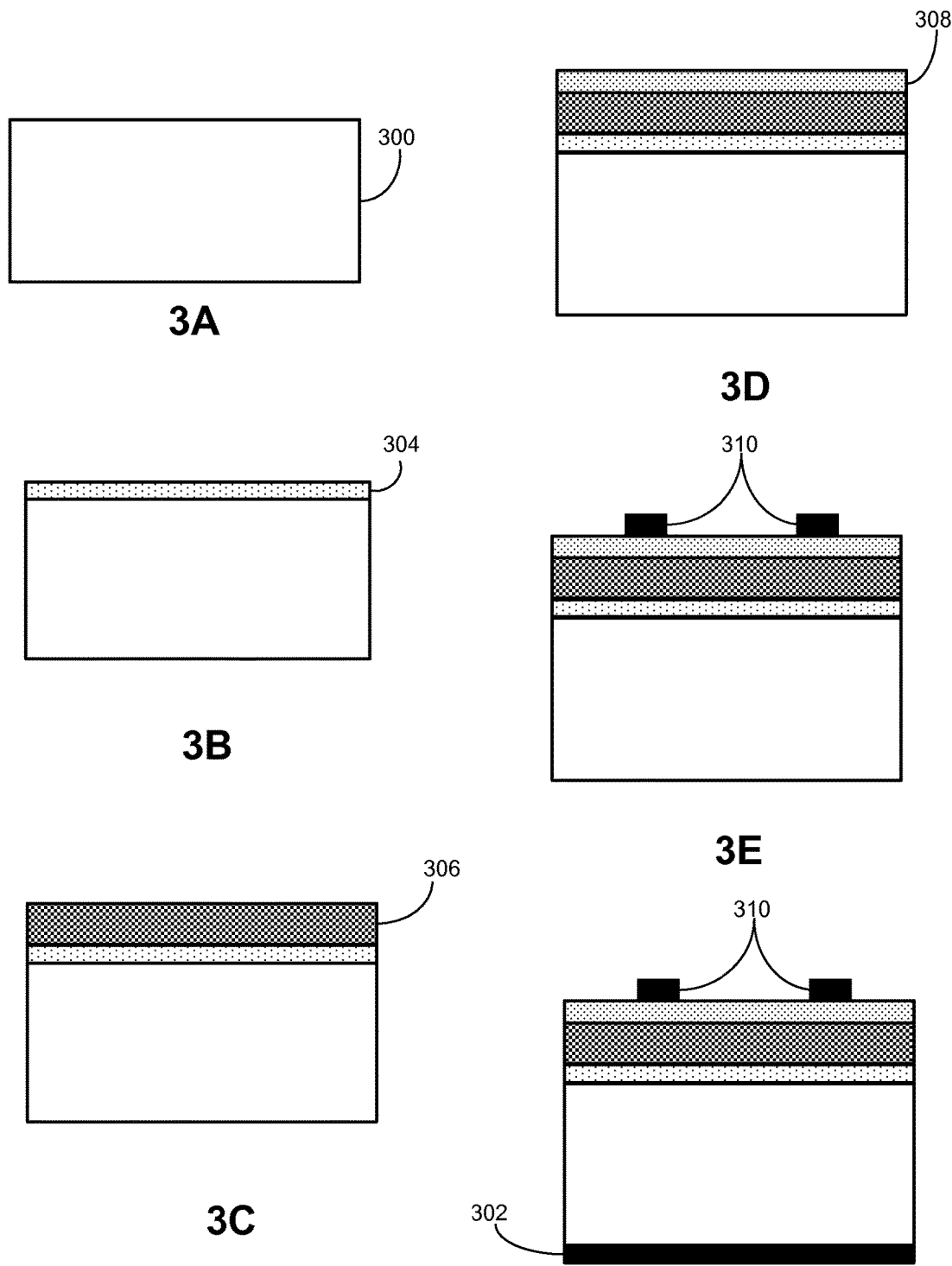
FIG. 3 presents a diagram illustrating the process of fabricating a solar cell in accordance with an embodiment of the present invention.

FIG. 3 presents a diagram illustrating the process of fabricating a solar cell in accordance with an embodiment of the present invention.

In operation 3A, a substrate 300 is prepared. In one embodiment, substrate 300 is a c-Si substrate, which is textured and cleaned. C—Si substrate 300 can be either p-type doped or n-type doped. In one embodiment, c-Si substrate 300 is lightly doped with an n-type dopant, and the doping concentration of c-Si substrate 300 can be between $1 \times 10^{16}/cm^3$ and $1 \times 10^{17}/cm^3$. Note that other than using c-Si substrate (which is more expensive) as a base layer, it is also possible to deposit a thin c-Si epitaxial film on a relatively cheaper metallurgical-grade Si (MG-Si) substrate to act as a base layer, thus lowering the manufacturing cost. The thickness of the c-Si epitaxial film can be between 5 μm and 100 μm. The surface of c-Si substrate 300 can be textured to maximize light absorption inside the solar cell, thus further enhancing efficiency. The surface texturing can be performed using various etching techniques including dry plasma etching and wet etching. The etchants used in the dry plasma etching include, but are not limited to: $SF_6$, $F_2$, and $NF_3$. The wet etching etchant can be an alkaline solution. The shapes of the surface texture can be pyramids or inverted pyramids, which are randomly or regularly distributed on the surface of c-Si substrate 300.

In operation 3B, a passivation layer 304 is deposited on top of c-Si substrate 300. Passivation layer 304 can significantly reduce the density of surface carrier recombination, thus increasing the solar cell efficiency. Passivation layer 304 can be formed using different materials such as intrinsic a-Si or silicon-oxide ($SiO_x$). In one embodiment, a layer of intrinsic a-Si is deposited on c-Si substrate 300 to form passivation layer 304. Techniques used for forming passivation layer 304 include, but are not limited to: PECVD, sputtering, and electron beam (e-beam) evaporation. The thickness of passivation layer 304 can be between 3 nm and 10 nm.

In operation 3C, a heavily doped p-type doped amorphous semiconductor layer is deposited on passivation layer 304 to form an emitter layer 306. The p-type amorphous semiconductor can be a-Si or amorphous SiC (a-SiC). In one embodiment, emitter layer 306 includes a-Si. The doping concentration of emitter layer 306 can be between $1 \times 10^{17}/cm^3$ and $5 \times 10^{20}/cm^3$. The thickness of emitter layer 306 can be between 3 nm and 10 nm. Techniques used for depositing emitter layer 306 include PECVD. Because the thickness of emitter layer 306 can be much smaller compared with that of the emitter layer in a homojunction solar cell, the absorption of short wavelength light is significantly reduced, thus leading to higher solar cell efficiency.

In operation 3D, a layer of high work function TCO material is deposited on top of emitter layer 306 to form TCO layer 308. Compared with conventional TCO material, such as ITO, used in solar cells, TCO layer 308 includes TCO material with a relatively higher work function. In one embodiment, the work function of TCO layer 308 is between 4.9 eV and 6.1 eV. Examples of high work function TCO include, but are not limited to: GaInO (GIO), GaInSnO (GITO), ZnInO (ZIO), ZnInSnO (ZITO), their combinations, as well as their combination with ITO. Techniques used for forming TCO layer 308 include, but are not limited to: PECVD, sputtering, and e-beam evaporation. Note that in addition to providing low-resistance ohmic contact, the higher work function of TCO layer 308 can also result in a higher $V_{oc}$.

In operation 3E, metal front electrodes 310 are formed on top of TCO layer 308. Front metal electrodes 310 can be formed using various metal deposition techniques at a low temperature of less than 300° C. In one embodiment, front electrodes 310 are formed by screen-printing Ag paste. In another embodiment, front electrodes 310 are formed by electroplating Cu and/or Ni.

In operation 3F, a back electrode 302 is formed on the opposite side to the front side. In one embodiment, the back electrode stack can include a passivation layer, an n-typed heavily doped semiconductor layer, a TCO or a metal layer with relatively low work function (such as between 4.0 eV and 5.0 eV), and a metal grid.

After the formation of front electrodes 310 and back electrode 302, various techniques such as laser scribing can be used for cell isolation to enable series interconnection of solar cells.

Although adopting high work function TCO material can result in lower contact resistance between TCO layer 308 and emitter layer 306, high work function TCO material tends to have a larger resistivity than that of the ITO. For example, an ITO material that has 5% tin oxide has a low resistivity of 200 $\mu\Omega \cdot cm$, which is much smaller than that of the high work function TCO materials. Hence, to reduce the overall resistance, TCO layer 308 may be a bi-layer structure that includes a high work function TCO sub-layer and an ITO sub-layer.

Figure 4:
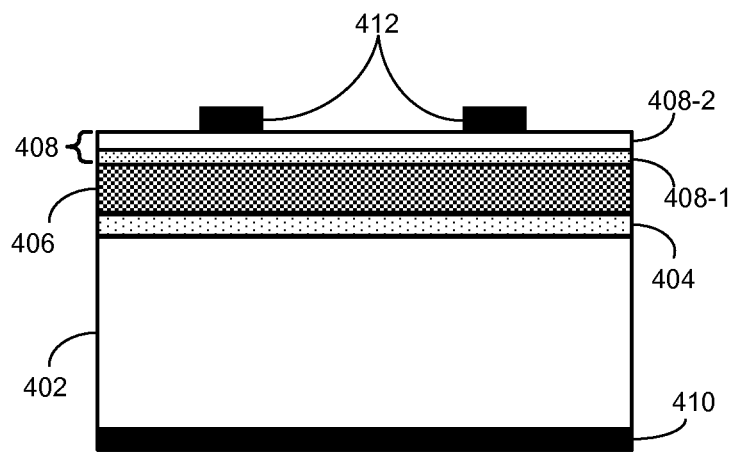
FIG. 4 presents a diagram illustrating an exemplary solar cell in accordance with an embodiment of the present invention.

FIG. 4 presents a diagram illustrating an exemplary solar cell in accordance with an embodiment of the present invention. Solar cell 400 includes a base layer 402, a passivation layer 404, an emitter layer 406, a TCO layer 408, a back-side electrode 410, and a front-side metal grid 412.

Base layer 402 can be a c-Si substrate or an epitaxially formed c-Si thin film. Passivation layer 404 can be an oxide layer or a layer of intrinsic a-Si. Emitter layer 406 can be either p-type doped or n-type doped. In one embodiment, emitter layer 406 is p-type doped a-Si. TCO layer 408 includes two sub-layers 408-1 and 408-2. Sub-layer 408-1 is on top of emitter layer 406. To ensure a good ohmic contact with a low contact resistance, in one embodiment, sub-layer 408-1 is formed using high work function TCO material, including, but not limited to: GaInO (GIO), GaInSnO (GITO), ZnInO (ZIO), ZnInSnO (ZITO), and their combinations. Sub-layer 408-2 includes TCO materials having low resistivity, such as ITO, tin-oxide ($SnO_x$), aluminum doped zinc-oxide (ZnO:Al), or Ga doped zinc-oxide (ZnO:Ga). Back-side electrode can include a passivation layer, an n-typed heavily doped semiconductor layer, a TCO or a metal layer with relatively low work function (such as that between 4.0 eV and 5.0 eV), and a metal grid. Front-side metal grid 412 can include screen-printed Ag grid or electroplated Cu and/or Ni grid.

In addition to be deposited on the front side (the side facing the sun) of the solar cell, the high work function TCO layer can also be used on the side opposite to the incidence of sunlight. In one embodiment, the passivation layer and the heavily doped p-type semiconductor layer are deposited on the back side of the c-Si base layer, facing away from incident light. The high work function TCO layer is then deposited on the back side as well. The electrode on the front side of the solar cell includes a TCO layer with lower work function, such as ITO. The solar cell performance can still benefit from the low ohmic contact resistance between the high-work function TCO and the heavily doped p-type semiconductor layer.

Figure 5:
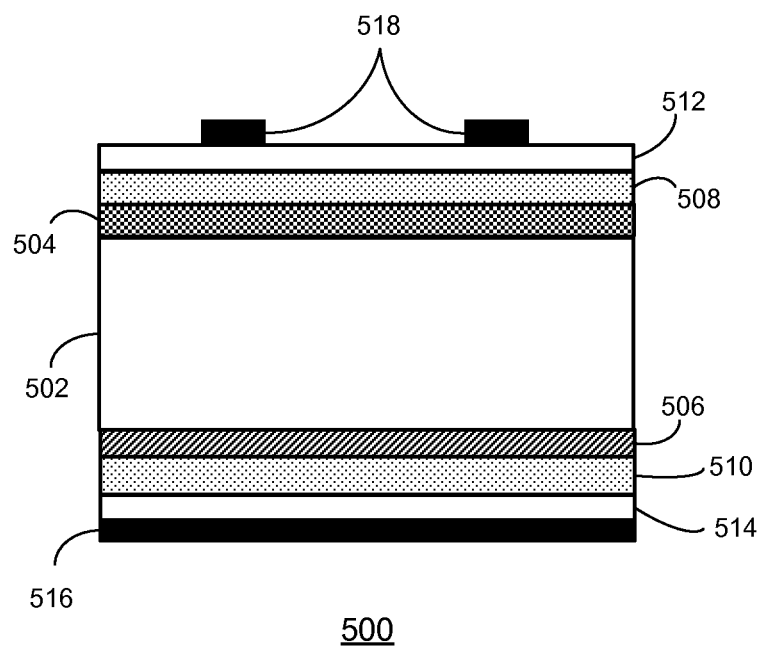
FIG. 5 presents a diagram illustrating an exemplary solar cell in accordance with an embodiment of the present invention In the figures, like reference numerals refer to the same figure elements.

FIG. 5 presents a diagram illustrating an exemplary solar cell in accordance with an embodiment of the present invention. Solar cell 500 includes a base layer 502, passivation layers 504 and 506, an emitter layer 508, a BSF layer 510, TCO layers 512 and 514, a back-side electrode 516, and a front-side electrode 518.

Base layer 502 can be lightly doped c-Si. In one embodiment, base layer 502 is p-type doped. Passivation layers 504 and 506 can include an intrinsic a-Si or oxide layer or a combination thereof. Emitter layer 508 can be heavily doped n-type amorphous semiconductor, and BSF layer 510 can be heavily doped p-type amorphous semiconductor, such as a-Si or a-SiC. Front-side TCO layer 512 interfaces with n-type doped emitter layer 508, and includes low work function TCO material, such as ITO. Back-side TCO layer 514 interfaces with p-type doped BSF layer 510, and includes high work function TCO material, such as GIO, GITO, ZIO, ZITO, and their combinations. Back-side electrode 516 and front-side electrode 518 are similar to the ones shown in FIG. 4.

Note that it is also possible to place the heavily doped p-type emitter on the back side of the solar cell with a lightly doped n-type base layer, and to include a front surface field (FSF) layer. As long as the TCO material interfacing with heavily doped p-type material has a relatively high work function, the overall performance of the solar cell can benefit from the reduced ohmic contact resistance between the TCO and the heavily doped p-type material.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A photovoltaic structure, comprising:
    a Si base layer;
    a p-type doped amorphous Si layer positioned on a first side of the Si base layer;
    an n-type doped semiconductor layer positioned on a second side of the Si base layer;
    a first transparent-conductive-oxide layer positioned on and in direct contact with the p-type doped amorphous Si layer, wherein the first transparent-conductive-oxide layer has a work function that is greater than 5.7 eV and less than to 6.1 eV, thereby reducing potential barriers for carriers at an interface between the p-type doped amorphous Si layer and the first transparent-conductive-oxide layer; and
    a second transparent-conductive-oxide layer positioned on and in direct contact with the n-type doped semiconductor layer, wherein the second transparent-conductive-oxide layer has a work function that is lower than the work function of the first transparent-conductive-oxide layer.

2. The photovoltaic structure of claim 1, further comprising a first metallic grid positioned on the first transparent-conductive-oxide layer, wherein the first metallic grid comprises an electroplated layer that includes Cu.

3. The photovoltaic structure of claim 1, further comprising a metallic grid positioned on the second transparent-conductive-oxide layer, wherein the metallic grid comprises an electroplated layer that includes Cu.

4. The photovoltaic structure of claim 1, wherein the Si base layer includes a crystalline-Si substrate or an epitaxially formed crystalline-Si thin film.

5. The photovoltaic structure of claim 1, further comprising at least one of:
    a first passivation layer positioned between the Si base layer and the p-type doped amorphous Si layer; and
    a second passivation layer positioned between the Si base layer and the p-type doped amorphous Si layer.

6. The photovoltaic structure of claim 5, wherein the first passivation layer and the second passivation layer include at least one of: undoped amorphous Si and $SiO_x$.

7. The photovoltaic structure of claim 1, wherein the p-type doped amorphous Si layer comprises amorphous Si or amorphous Si containing carbon, and wherein the p-type doped amorphous Si layer has a doping concentration between $1\times10^{17}/cm^3$ and $5\times10^{20}/cm^3$.

8. The photovoltaic structure of claim 1, further comprising a third transparent-conductive-oxide layer positioned on the first transparent-conductive-oxide layer, wherein the third transparent-conductive-oxide is selected from a group consisting of: indium tin oxide (ITO), tin-oxide ($SnO_x$), aluminum doped zinc-oxide (ZnO:Al), Ga doped zinc-oxide (ZnO:Ga), and any combination thereof.

9. The photovoltaic structure of claim 1, wherein the second transparent-conductive-oxide layer comprises indium tin oxide (ITO).

* * * * *